United States Patent
Chou et al.

(10) Patent No.: US 10,297,491 B2
(45) Date of Patent: *May 21, 2019

(54) SEMICONDUCTOR DEVICE HAVING ISOLATION STRUCTURE IN WELL OF SUBSTRATE

(71) Applicant: TAIWAN SEMICONDUCTOR MANUFACTURING COMPANY, LTD., Hsinchu (TW)

(72) Inventors: Chien-Chih Chou, New Taipei (TW); Kong-Beng Thei, Pai-Shan Village (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/861,090

(22) Filed: Jan. 3, 2018

(65) Prior Publication Data

US 2018/0145136 A1    May 24, 2018

Related U.S. Application Data

(63) Continuation of application No. 15/083,844, filed on Mar. 29, 2016, now Pat. No. 9,871,105, which is a (Continued)

(51) Int. Cl.
*H01L 21/8242*    (2006.01)
*H01L 21/762*    (2006.01)
(Continued)

(52) U.S. Cl.
CPC ...... *H01L 21/76205* (2013.01); *H01L 21/761* (2013.01); *H01L 29/0653* (2013.01);
(Continued)

(58) Field of Classification Search
CPC ............... H01L 29/1083; H01L 21/761; H01L 21/76205; H01L 29/0653; H01L 29/4236;
(Continued)

(56) References Cited

U.S. PATENT DOCUMENTS 6,395,598 B1    5/2002    Hirai et al.
8,253,193 B2 *  8/2012    Denison .............. H01L 29/0865
                                                        257/329

(Continued)

FOREIGN PATENT DOCUMENTS

CN        101399287        4/2009

OTHER PUBLICATIONS

Office Action dated Oct. 23, 2015 from corresponding No. TW 103124695.
(Continued)

*Primary Examiner* — Selim U Ahmed
*Assistant Examiner* — Andre C Stevenson
(74) *Attorney, Agent, or Firm* — Hauptman Ham, LLP

(57) ABSTRACT

A structure of a semiconductor includes an isolation structure in a well of a substrate. An upper surface of the isolation structure in the well of the substrate is lower than an upper surface of the substrate and an upper surface of the well. A gate electrode has a first portion over the isolation structure, and a second portion laterally adjacent to the first portion, and above the first portion.

20 Claims, 6 Drawing Sheets

Related U.S. Application Data continuation of application No. 14/163,134, filed on Jan. 24, 2014, now Pat. No. 9,318,366.

(60) Provisional application No. 61/923,951, filed on Jan. 6, 2014.

(51) Int. Cl.
| | |
|---|---|
| *H01L 29/423* | (2006.01) |
| *H01L 29/66* | (2006.01) |
| *H01L 29/78* | (2006.01) |
| *H01L 29/06* | (2006.01) |
| *H01L 29/10* | (2006.01) |
| *H01L 21/761* | (2006.01) |
| *H01L 29/40* | (2006.01) |

(52) U.S. Cl.
CPC ...... *H01L 29/1083* (2013.01); *H01L 29/4236* (2013.01); *H01L 29/42368* (2013.01); *H01L 29/66659* (2013.01); *H01L 29/66681* (2013.01); *H01L 29/7835* (2013.01); *H01L 29/407* (2013.01); *H01L 29/665* (2013.01)

(58) Field of Classification Search
CPC ......... H01L 29/42368; H01L 29/66659; H01L 29/66681; H01L 29/7835; H01L 29/407; H01L 29/665
See application file for complete search history.

(56) References Cited

U.S. PATENT DOCUMENTS

| | | | |
|---|---|---|---|
| 8,497,175 B2* | 7/2013 | Kahng | H01L 29/42384 438/221 |
| 8,772,871 B2 | 7/2014 | Yang et al. | |
| 9,318,366 B2* | 4/2016 | Chou | H01L 21/76205 |
| 2008/0318388 A1 | 12/2008 | Lin et al. | |
| 2009/0085112 A1 | 4/2009 | Ho et al. | |
| 2014/0042527 A1* | 2/2014 | Lee | H01L 29/4236 257/330 |

OTHER PUBLICATIONS

Office Action dated Apr. 12, 2017 from corresponding application No. CN 201410138290.6.

* cited by examiner

SEMICONDUCTOR DEVICE HAVING ISOLATION STRUCTURE IN WELL OF SUBSTRATE

PRIORITY CLAIM

The present application is a continuation of U.S. application Ser. No. 15/083,844, filed Mar. 29, 2016, which is a continuation of U.S. application Ser. No. 14/163,134, filed Jan. 24, 2014, now U.S. Pat. No. 9,318,366, issued Apr. 19, 2016, which claims the priority of U.S. Provisional Application No. 61/923,951, filed Jan. 6, 2014, which are incorporated herein in their entireties.

BACKGROUND

A metal-oxide semiconductor field effect transistor (MOSFET) has a gate electrode, a substrate, and a gate dielectric layer between the gate electrode and the substrate. By controlling a voltage level at the gate electrode, a conductive channel, in the substrate underneath the gate dielectric layer, is generated or modulated accordingly. In some applications, a gate-to-source breakdown voltage of a MOSFET is increased by increasing a thickness of the gate dielectric layer. In some applications, a drain-to-source breakdown voltage of a MOSFET is increased by introducing a diffused drain region. Various types of MOSFETs are configured to have increased breakdown voltage, including, for example, lateral diffused metal-oxide semiconductor (LDMOS) transistors and double diffused drain metal-oxide semiconductor (DDDMOS) transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
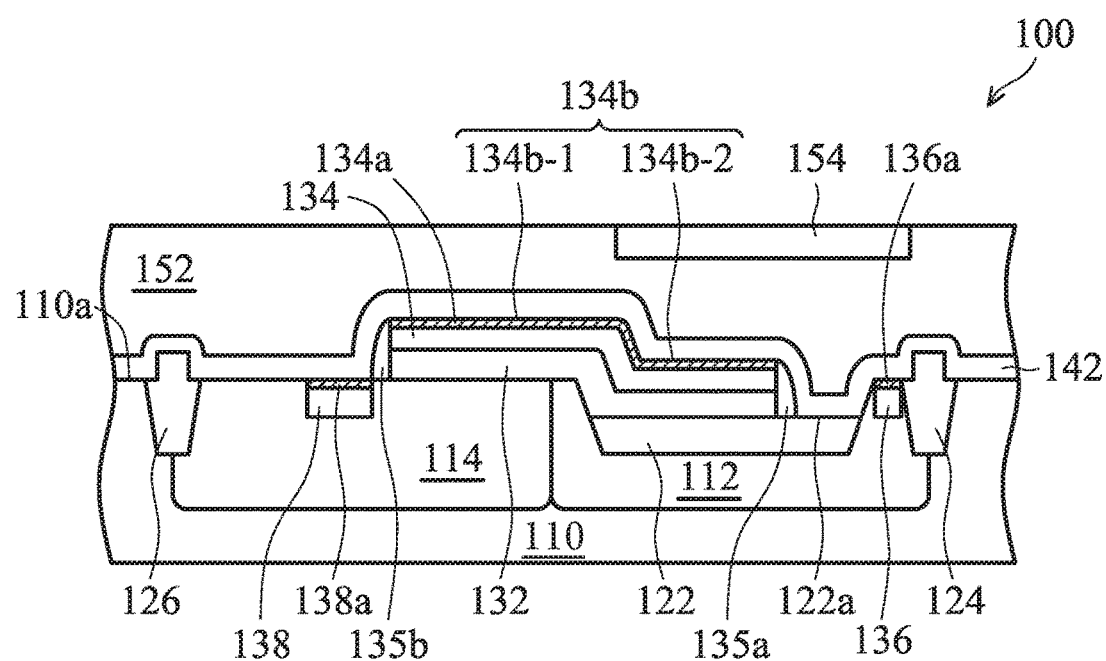
FIG. 1 is a cross-sectional view of an integrated circuit in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the gate dielectric layer of an LDMOS or a DDDMOS has at least two or more segments with different thickness. In some embodiments, the thickness of the gate dielectric layer is implemented by an isolation structure buried in the substrate and a layer of gate dielectric material formed thereon. An upper surface of the isolation structure is lower than an upper surface of the substrate. As a result, a process margin for preventing a short circuit between a conductive line and a gate electrode, which are directly above the isolation structure, is improved. In some embodiments, the improved process margin allows further reducing a thickness of an inter-layer dielectric (ILD) layer on which the conductive line is formed.

FIG. 1 is a cross-sectional view of an integrated circuit 100 in accordance with some embodiments. In some embodiments, integrated circuit 100 depicted in FIG. 1 is an intermediate product, which will be further processed by one or more manufacturing processes in order to form a functional integrated circuit. Other active electrical components and passive electrical components of the integrated circuit 100 are not shown in FIG. 1.

Integrated circuit 100 has a substrate 110, which is subjected to one or more implantation processes to form a first well 112 and a second well 114. Integrated circuit 100 also has isolation structures 122, 124, and 126, a gate dielectric structure 132, a gate electrode structure 134, a spacer structure 135, a drain region 136, a source region 138, a etch stop layer 142, an inter-layer dielectric (ILD) layer 152, and a conductive line 154. In some embodiments, wells 112 and 114, isolation structure 122, gate dielectric structure 132, gate electrode structure 134, spacer structure 135, drain region 136, and source region 138 together constitute a lateral diffused metal-oxide semiconductor (LDMOS) transistor. The LDMOS in FIG. 1 is disclosed as an example. In some embodiments, the disclosed method is applicable for fabricating other types of LDMOS transistors or various types of double diffused drain metal-oxide semiconductor (DDDMOS) transistors.

In some embodiments, substrate 110 includes: an elementary semiconductor such as silicon or germanium in crystal, polycrystalline, or an amorphous structure; a compound semiconductor including silicon carbide, gallium arsenide, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. In at least one embodiment, substrate 110 is an alloy semiconductor substrate having a gradient SiGe feature in which the Si and Ge composition change from one ratio at one location to another ratio at another location of the gradient SiGe feature. In another embodiment, the alloy SiGe is formed over a silicon substrate. In yet another embodiment, a SiGe substrate is strained. In some further embodiments, substrate 110 is a semiconductor on insulator. In some examples, substrate 110 includes an epitaxial layer or a buried layer. In other examples, substrate 110 includes a multilayer compound semiconductor structure.

In some embodiments, substrate 110 generally exhibits a conductive characteristic similar to that of an intrinsic semiconductor material or a semiconductor material having a predetermined doping type. In some embodiments, the predetermined doping type is a P-type doping.

Substrate 110 has first well 112 and second well 114 formed between isolation structures 124 and 126. Wells 112 and 114 have different types of doping. In some embodiments, if the LDMOS transistor in FIG. 1 is an N-type transistor, first well 112 has an N-type doping, and second well 114 has a P-type doping. In some embodiments, if the LDMOS transistor in FIG. 1 is a P-type transistor, first well 112 has a P-type doping, and second well 114 has an N-type doping. In some embodiments, one or more deep wells (not shown) are formed under first and second wells 112 and 114 in order to electrically isolate the first and second wells 112 and 114 from substrate 110.

Isolation structure 122 is buried in first well 112 of substrate 110. An upper surface 122a of isolation structure 122 is lower than an upper surface 110a of substrate 110. In some embodiments, a vertical distance between the upper surface 122a of isolation structure 122 and the upper surface 110a of substrate 110 is equal to or greater than 300 Å. In some embodiments, isolation structure 122 includes silicon oxide.

Gate dielectric structure 132 is partially on second well 114 of substrate 110, partially on first well 112 of substrate 110, and partially on the upper surface 122a of isolation structure 122. In some embodiments, gate dielectric structure 132 includes silicon oxide or a high dielectric constant (high-k) dielectric material. In some embodiments, gate dielectric structure 132 has a multi-layer structure including one or more layers of different dielectric materials. In some embodiments, gate dielectric structure 132 is configured to have sufficient thickness in order to allow the resulting transistor to have a predetermined gate-to-source breakdown voltage. In some embodiments, the gate electrode structure 134 of the resulting LDMOS in FIG. 1 is configured to operate at about 32 Volts, and the gate dielectric structure 132 is configured to have a thickness ranging from 200 Å to 1200 Å.

Gate electrode structure 134 is over gate dielectric structure 132. In some embodiments, gate electrode structure 134 includes polysilicon or one or more metallic materials, such as copper, aluminum, tungsten, titanium, an alloy thereof, or a combination thereof. In some embodiments, gate electrode structure 134 has a multi-layer structure. In FIG. 1, an upper portion of gate electrode structure 134 includes a silicide layer 134a. In some embodiments, silicide layer 134a is omitted. An upper surface 134b of gate electrode structure 134 has a first portion 134b-1 directly over isolation structure 122 and a second portion 134b-2 directly over second well 114. In some embodiments, the first portion 134b-1 of the upper surface 134b is level with or lower than the second portion 134b-2 of the upper surface 134.

Moreover, spacer structure, including a first spacer 135a and a second spacer 135b, is on sidewalls of gate dielectric structure 132 and gate electrode structure 134. In some embodiments, spacers 135a and 135b has a material including silicon nitride. First spacer 135a is over isolation structure 122, and second spacer 135b is over second well 114 and between isolation structure 122 and isolation structure 126. Drain region 136 is in first well 112 and between isolation structure 122 and isolation structure 124. Source region 138 is in second well 114 between second spacer 135b of spacer structure 135 and isolation structure 126. In some embodiments, if the LDMOS transistor in FIG. 1 is an N-type transistor, drain region 136 and source region 138 has an N-type doping with a doping concentration greater than that of the first well 112. In some embodiments, if the LDMOS transistor in FIG. 1 is a P-type transistor, drain region 136 and source region 138 has a P-type doping with a doping concentration greater than that of the first well 112. An upper portion of drain region 136 includes a silicide layer 136a. An upper portion of source region 138 includes a silicide layer 138a. In some embodiments, silicide layers 133a and 138a are omitted.

Moreover, etch stop layer 142 covers substrate 110 and the LDMOS transistor in FIG. 1. ILD layer 152 is over etch stop layer 142, and conductive line 154 is formed on the ILD layer 152. The cross-sectional view in FIG. 1 is taken from a position that conductive line 154 is not physically in contact with gate electrode structure 134, drain region 136, or source region 138. In some embodiments, conductive line 154 and one or more of gate electrode structure 134 drain region 136, or source region 138 are electrically coupled at a position other than where the cross-sectional view in FIG. 1 is taken.

In some embodiments, because the upper surface 122a of isolation structure 122 is lower than the upper surface 110a of substrate 110, the first portion 134b-1 of the upper surface 134b is also lower than the second portion 134b-2 of the upper surface 134. As a result, a vertical distance between conductive line 154 and gate electrode structure 134 directly above isolation structure 122 is greater than that between conductive line 154 and gate electrode structure 134 directly above second well 114. In some embodiments, the increased gap between conductive line 154 and gate electrode structure 134 over isolation structure 122 provides additional process margin for preventing unintended shorting between conductive line 154 and gate electrode structure 134 attributable to process variations.

In some embodiments, a layout design rule for designing integrated circuit 100 is set in a manner that the conductive lines of the same conductive layer of conductive line 154 is prohibited to passing over second portion 134b-2 of the upper surface 134 of a LDMOS transistor.

Figure 2:
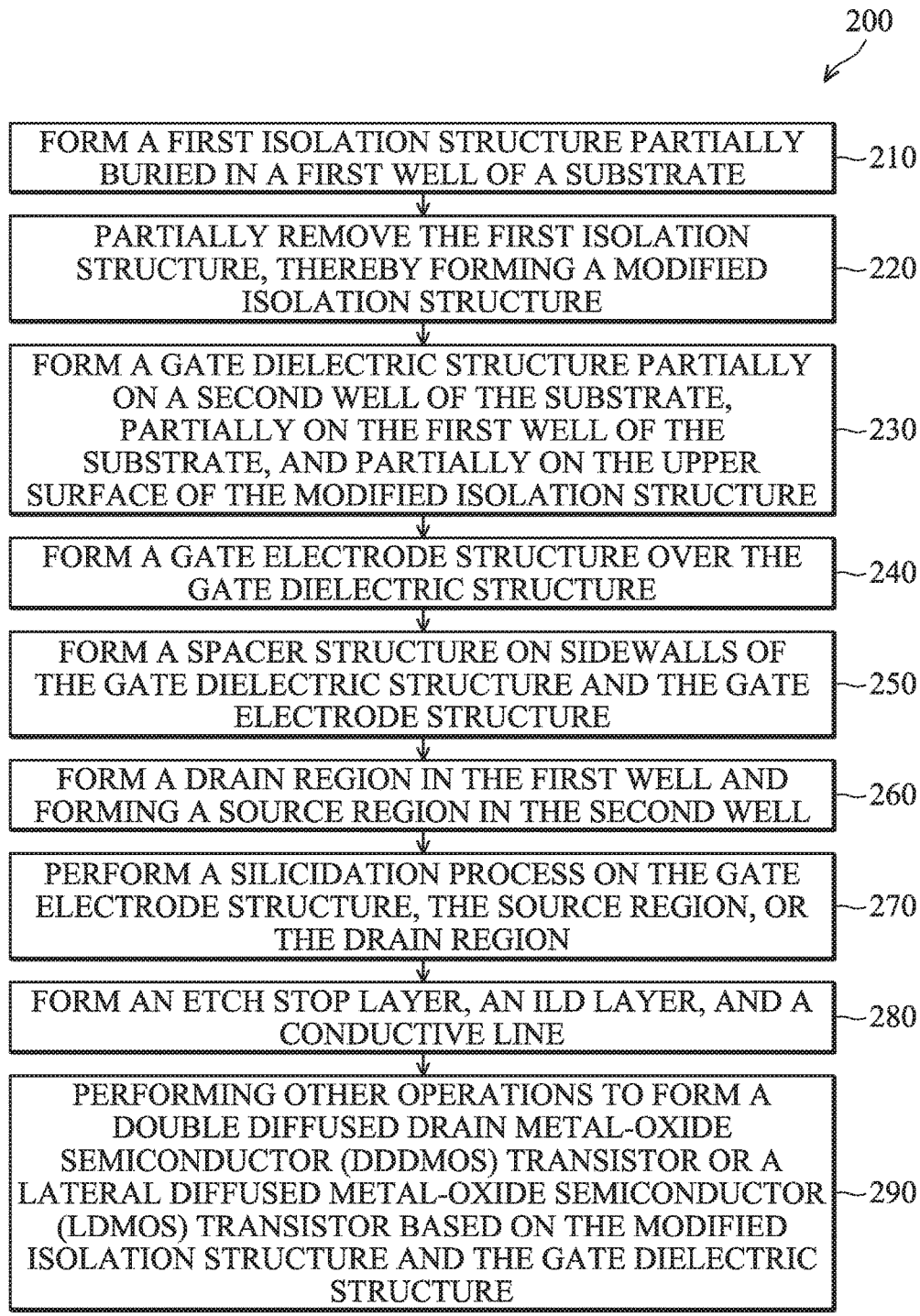
FIG. 2 is a flow chart of a method of fabricating an integrated circuit in accordance with some embodiments.

FIG. 2 is a flow chart of a method 200 of fabricating an integrated circuit 100 in accordance with some embodiments. FIGS. 3A to 3H are cross-sectional views of integrated circuit 100 at various manufacturing stages in accordance with some embodiments. Components in FIGS. 2 and 3A to 3H that are the same or similar to those in FIG. 1 are given the same reference numbers, and detailed description thereof is omitted. It is understood that additional operations may be performed before, during, and/or after the method 200 depicted in FIG. 2, and that some other processes may only be briefly described herein.

As depicted in FIG. 2 and FIG. 1, the process 200 begins at operation 210, where isolation structures are formed in a substrate. The substrate has a first well having a first doping type and a second well having a second doping type. A first isolation structure is formed in the first well, and a second and a third isolation structures are formed at edges of the first well and the second well. In some embodiments, the first, second, and third isolation structures are formed by performing a local oxidation of silicon (LOCOS) process or a shallow trench isolation (STI) process. In some embodiments, operation 210 further includes forming a patterned mask to protect the second and third isolation structures from one or more following operations.

Figure 3A:
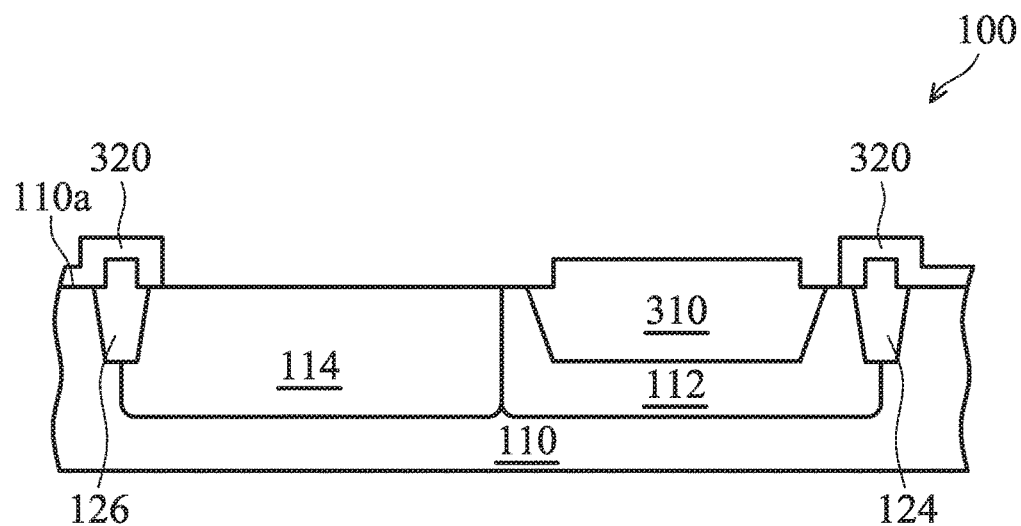
FIGS. 3A to 3G are cross-sectional views of an integrated circuit at various manufacturing stages in accordance with some embodiments.

FIG. 3A is a cross-sectional view of integrated circuit 100 after operation 210. A first isolation structure 310 is partially buried in a first well 112 of a substrate 110. An upper portion of the first isolation structure 310 protrudes from an upper surface 110a of the substrate 110. A second isolation structure 124 is partially buried in substrate 110 at an edge of first well 112. A third isolation structure 126 is partially buried in substrate 110 at an edge of second well 114. In some embodiments, the first, second, and third isolation structures 310, 124, and 126 have about the same depth under the upper surface 110a. A majority portion of first well 112, second well 114, and the entire first isolation structure 310 are between isolation structures 124 and 126. A patterned mask 320 covers the second and third isolation structures 124 and 126.

The process 200 proceeds to operation 220, where the first isolation structure is partially removed to form a modified isolation structure. An upper surface of the modified isolation structure is lower than the upper surface of the substrate. In some embodiments, operation 220 includes performing a dry oxide etch process and/or a wet oxide etch process. In some embodiments, the dry etch process includes an anisotropic etching based on carbon-fluoride gases. In some embodiments, the wet etch process includes using a solution of hydrofluoric acid, such as buffer oxide etchant (BOE) or buffer solution of hydrofluoric acid (BHF).

Figure 3B:
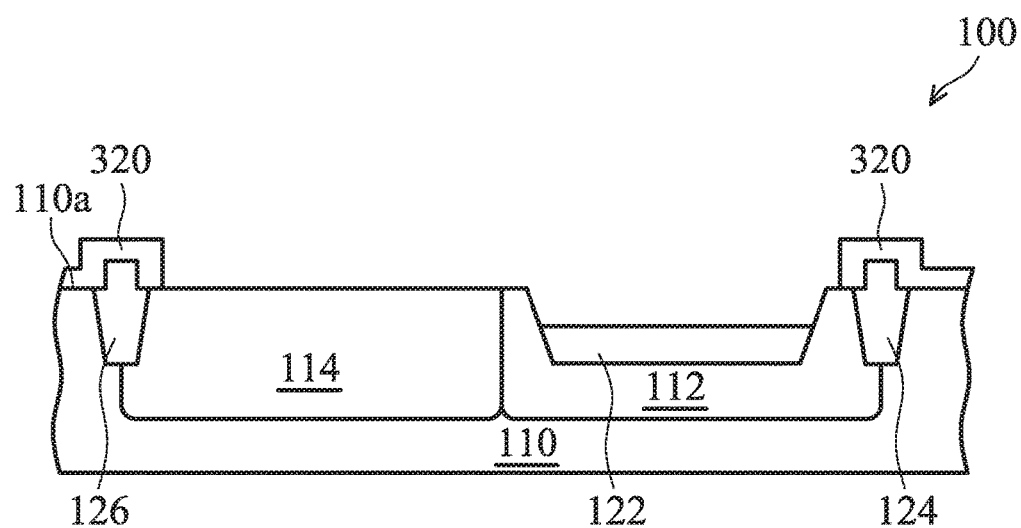

FIG. 3B is a cross-sectional view of integrated circuit 100 after operation 220. First isolation structure 310 is converted into a modified isolation structure 122. An upper surface 122a of modified isolation structure 122 is lower than the upper surface 110a of the substrate 110. In some embodiments, a vertical distance between the upper surface 122a of the modified isolation structure 122 and the upper surface 110a of the substrate 110 is equal to or greater than 300 Å. The patterned mask 320 remains to protect the second and third isolation structures 124 and 126 from one or more following operations.

The process 200 proceeds to operation 230, where a gate dielectric structure is formed. The gate dielectric is partially on a second well of the substrate, partially on the first well of the substrate, and partially on the upper surface of the modified isolation structure. In some embodiments, gate dielectric structure includes silicon oxide, and operation 230 includes performing a thermal oxidation process. In some embodiments, the thermal oxidation is performed in a furnace at a temperature ranging from 500° C. to 1100° C. In some embodiments, after forming the gate dielectric structure, operation 230 further includes removing the patterned mask formed in operation 210.

Figure 3C:
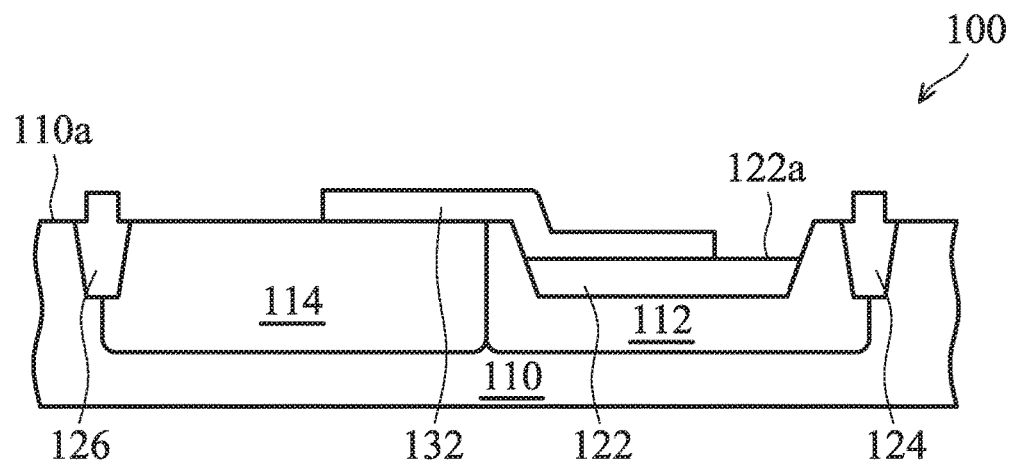

FIG. 3C is a cross-sectional view of integrated circuit 100 after operation 230. Gate dielectric structure 132 is on second well 114, first well 112, and the upper surface 122a of isolation structure 122. The patterned mask 320 has been removed.

The process 200 proceeds to operation 240, where a gate electrode structure is formed. The gate electrode structure is over the gate dielectric structure. In some embodiments, gate electrode structure includes polysilicon or one or more metallic materials.

Figure 3D:
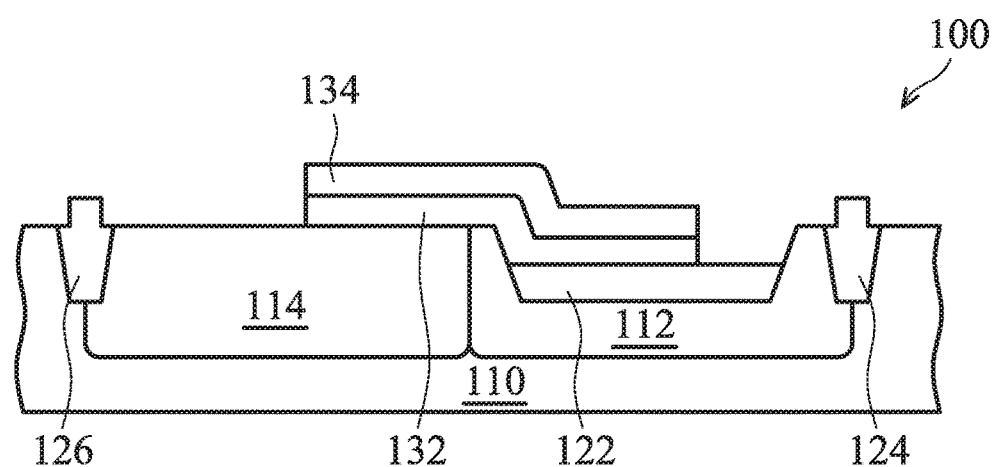

FIG. 3D is a cross-sectional view of integrated circuit 100 after operation 240. Gate electrode structure 134 is on gate dielectric structure 132.

In some embodiments, operation 230 and operation 240 are performed in a manner that one or more layers of gate dielectric materials are formed on the substrate 110 and isolation structure 122. Then, one or more layers of gate electrode materials are formed on the one or more layers of gate dielectric materials. Finally, the one or more layers of gate dielectric materials and the one or more layers of gate electrode materials are patterned to form gate dielectric structure 132 and gate electrode structure 134 in FIG. 3D.

The process 200 proceeds to operation 250, where a spacer structure is formed on sidewalls of the gate dielectric structure and the gate electrode structure. In some embodiments, operation 250 includes forming a layer of spacer material over the resulting structure in FIG. 3D and followed by an anisotropic etch process. In some embodiments, the spacer structure has a material including silicon nitride.

Figure 3E:
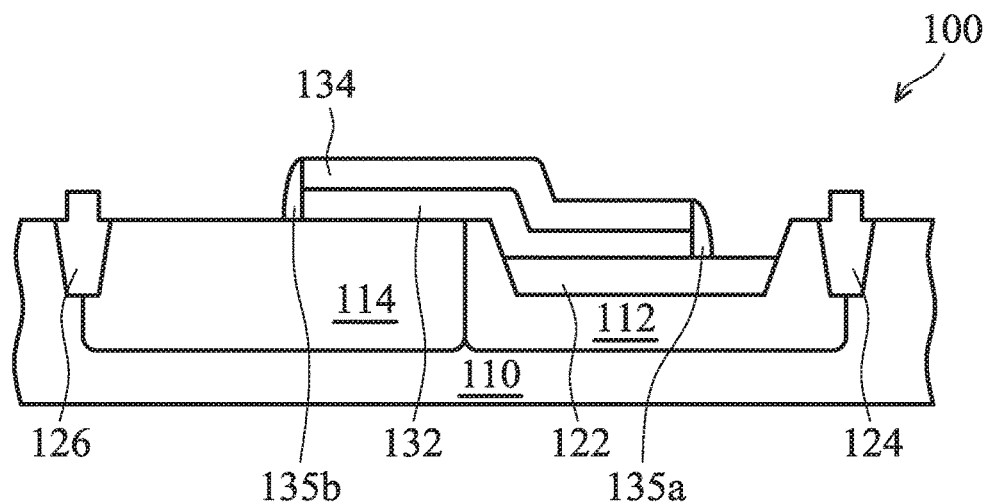

FIG. 3E is a cross-sectional view of integrated circuit 100 after operation 250. Spacer structure, including a first spacer 135a and a second spacer 135b, is on sidewalls of the gate dielectric structure 132 and the gate electrode structure 134. First spacer 135a is on isolation structure 122 over the first well. Second spacer 135b is over the second well between the modified isolation structure 122 and third isolation structure 126.

The process 200 proceeds to operation 260, where a drain region is formed in the first well and a source region is formed in the second well. In some embodiments, operation 260 includes forming a mask that exposes a portion of first well for forming the drain region and exposes a portion of second well for forming the source region, followed by an implantation process.

Figure 3F:
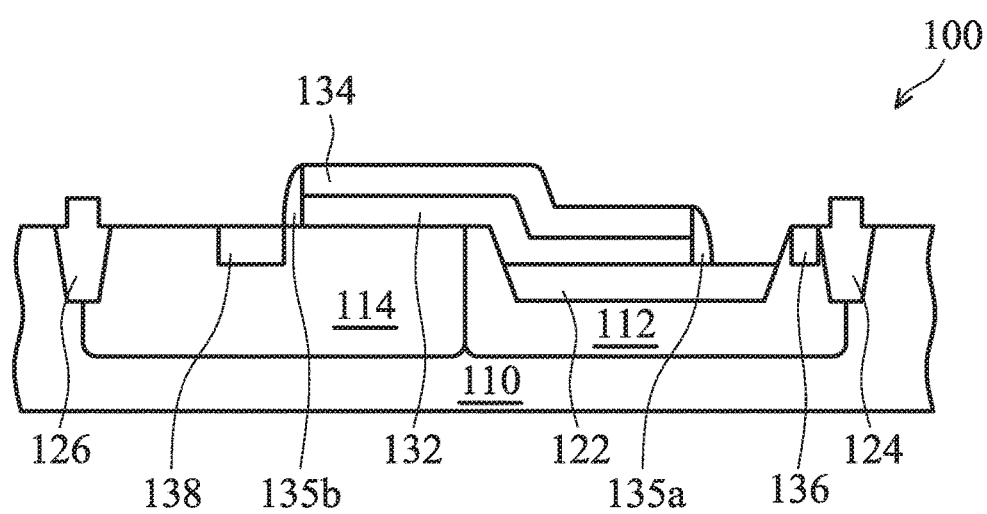

FIG. 3F is a cross-sectional view of integrated circuit 100 after operation 260. A drain region 136 is formed in the first well 112 between the modified isolation structure 122 and second isolation structure 124. Also, a source region 138 is formed in the second well 114 between the spacer 135b and third isolation structure 126.

The process 200 proceeds to operation 270, where a silicidation process is performed on the gate electrode structure, the source region, or the drain region. In some embodiments, operation 270 includes forming a layer of metallic material on the gate electrode structure, the source region, or the drain region, and followed by an annealing process to form the silicide layers and a removal process to remove unreacted metallic material.

Figure 3G:
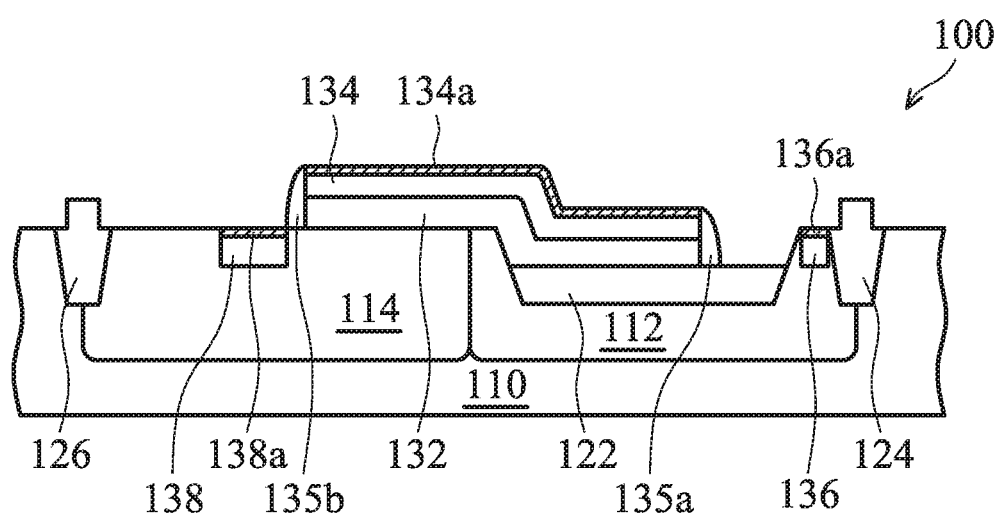

FIG. 3G is a cross-sectional view of integrated circuit 100 after operation 270. An upper portion of gate electrode 134 is converted into a silicide layer 134a. An upper portion of drain region 136 is converted into a silicide layer 136a. Also, an upper portion of source region 138 is converted into a silicide layer 138a. In some embodiments, not all of the gate electrode 134, drain region 136, and source region 138 are processed by the silicidation process of operation 270. In some embodiments, operation 270 is omitted.

The process 200 proceeds to operation 280, including forming an etch stop layer over the resulting structure of operation 270, forming an ILD layer over the etch stop layer, and forming a conductive line on the ILD layer. In some embodiments, prior to forming the conductive line, the ILD is selectively etched to form contact openings and one or more contact plugs are formed in the contact openings. In some embodiments, a chemical mechanical planarization (CMP) is performed in conjunction with the formation of contact plugs.

FIG. 1 depicts a cross-sectional view of integrated circuit 100 after operation 260.

The process 200 proceeds to operation 290, where additional operations are performed to form a lateral diffused metal-oxide semiconductor (LDMOS) transistor based on the modified isolation structure 122 and the gate dielectric structure 132. In some embodiments, operations 210 to 280 are also usable to form a resulting structure on which a double diffused drain metal-oxide semiconductor (DDD-MOS) transistor is based.

In an embodiment, a structure of a semiconductor includes a substrate; an isolation structure in a well of the substrate, an upper surface of the isolation structure in the well of the substrate being lower than an upper surface of the substrate; and a gate electrode having a first portion over the isolation structure, and a second portion laterally adjacent to the first portion, and above the first portion. In an embodiment, a top surface of the well is level with the upper surface of the substrate. In an embodiment, the upper surface of the isolation structure is lower than an upper surface of the well. In an embodiment, the structure includes a gate dielectric structure partially on the upper surface of the isolation structure. In an embodiment, the gate electrode is over the gate dielectric structure and has an upper surface having a first portion and a second portion, wherein the first portion of the upper surface of the gate electrode is directly over the isolation structure, and the first portion of the upper surface of the gate electrode is lower than the second portion of the upper surface of the gate electrode. In an embodiment the structure includes a spacer on sidewalls of the gate dielectric structure and the gate electrode. In an embodiment, the structure includes a gate dielectric structure partially on the substrate and partially on the upper surface of the isolation structure.

In an embodiment, an apparatus includes a first isolation structure in a first well of a substrate, the first well having a first doping type, an upper surface of the first isolation structure being lower than an upper surface of the substrate; and a gate dielectric partially on a second well of the substrate, partially on the first well of the substrate, and partially on the upper surface of the first isolation structure, the second well having a second doping type. In an embodiment, the first doping type of the apparatus is an N-type doping, and the second doping type is a P-type doping. In an embodiment, a vertical distance between the upper surface of the first isolation structure and the upper surface of the substrate is equal to or greater than 300 Å. In an embodiment, the apparatus includes a drain region in the first well, wherein the drain region is between the first isolation structure and a second isolation structure; and a source region in the second well, wherein the source region is between the first isolation structure and a third isolation structure. In an embodiment, the apparatus includes a gate electrode over the gate dielectric, wherein an upper surface of the gate electrode has a first portion directly over the first isolation structure, and a second portion directly over the second well. In an embodiment, the first portion of the upper surface of the gate electrode is level with or lower than the second portion of the upper surface of the gate electrode. In an embodiment, the apparatus includes a spacer structure on sidewalls of the gate dielectric and the gate electrode; a drain region in the first well, wherein the drain region is between the first isolation structure and a second isolation structure; and a source region in the second well, wherein the source region is between the first isolation structure and a third isolation structure, and between the spacer structure and the third isolation structure. In an embodiment, the apparatus includes a silicide layer over the first and second portions of the upper surface of the gate electrode.

In an embodiment, an integrated circuit includes a substrate having a first well and a second well; a first isolation structure in the first well of the substrate; a gate electrode structure over the first isolation structure, wherein an upper surface of the gate electrode structure has a first portion directly over the first isolation structure, wherein the first portion of the upper surface of the gate electrode structure is lower than a second portion of the upper surface of the gate electrode structure; a drain region in the first well; and a source region in the second well. In an embodiment, the drain region is between the first isolation structure and a second isolation structure, and the source region is between the first isolation structure and a third isolation structure. In an embodiment, the integrated circuit includes a spacer on sidewalls of the gate electrode structure and between the drain region and the source region. In an embodiment, the integrated circuit includes a gate dielectric structure having first and second portions over the first and second wells, wherein the first portion of the gate dielectric structure is above the second portion of the gate dielectric structure. In an embodiment, the integrated circuit includes a silicide layer over the first and second portions of the upper surface of the gate electrode structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure of a semiconductor, the structure comprising:
   a substrate;
   an isolation structure in a well of the substrate, wherein an upper surface of the isolation structure in the well of the substrate is lower than an upper surface of the substrate; and
   a gate electrode having a first portion over the isolation structure, and a second portion laterally adjacent to the first portion, and above the first portion.

2. The structure of claim 1, wherein a top surface of the well is level with the upper surface of the substrate.

3. The structure of claim 1, wherein the upper surface of the isolation structure is lower than an upper surface of the well.

4. The structure of claim 1, further comprising:
   a gate dielectric structure partially on the upper surface of the isolation structure.

5. The structure of claim 4, wherein:
   the gate electrode is over the gate dielectric structure, the gate electrode having an upper surface having a first portion and a second portion,
   the first portion of the upper surface of the gate electrode is directly over the isolation structure, and
   the first portion of the upper surface of the gate electrode is lower than the second portion of the upper surface of the gate electrode.

6. The structure of claim 5, further comprising:
   a spacer on sidewalls of the gate dielectric structure and the gate electrode.

7. The structure of claim 1, further comprising:
   a gate dielectric structure partially on the substrate and partially on the upper surface of the isolation structure.

8. An apparatus, comprising:
- a first isolation structure in a first well of a substrate, the first well having a first doping type, wherein an upper surface of the first isolation structure is lower than an upper surface of the substrate; and
- a gate dielectric partially on a second well of the substrate, partially on the first well of the substrate, and partially on the upper surface of the first isolation structure, the second well having a second doping type.

9. The apparatus of claim 8, wherein the first doping type is N-type doping, and the second doping type is P-type doping.

10. The apparatus of claim 8, wherein a vertical distance between the upper surface of the first isolation structure and the upper surface of the substrate is equal to or greater than 300 Å.

11. The apparatus of claim 8, further comprising:
- a drain region in the first well, wherein the drain region is between the first isolation structure and a second isolation structure; and
- a source region in the second well, wherein the source region is between the first isolation structure and a third isolation structure.

12. The apparatus of claim 8, further comprising:
- a gate electrode over the gate dielectric, wherein an upper surface of the gate electrode has a first portion directly over the first isolation structure, and a second portion directly over the second well.

13. The apparatus of claim 12, wherein the first portion of the upper surface of the gate electrode is level with or lower than the second portion of the upper surface of the gate electrode.

14. The apparatus of claim 12, further comprising:
- a spacer structure on sidewalls of the gate dielectric and the gate electrode;
- a drain region in the first well, wherein the drain region is between the first isolation structure and a second isolation structure; and
- a source region in the second well, wherein the source region is between the first isolation structure and a third isolation structure, and between the spacer structure and the third isolation structure.

15. The apparatus of claim 12, further comprising:
- a silicide layer over the first and second portions of the upper surface of the gate electrode.

16. An integrated circuit, comprising:
- a substrate having a first well and a second well;
- a first isolation structure in the first well of the substrate;
- a gate electrode structure over the first isolation structure, wherein an upper surface of the gate electrode structure has a first portion directly over the first isolation structure, wherein the first portion of the upper surface of the gate electrode structure is lower than a second portion of the upper surface of the gate electrode structure;
- a drain region in the first well; and
- a source region in the second well.

17. The integrated circuit of claim 16, wherein:
the drain region is between the first isolation structure and a second isolation structure, and
the source region is between the first isolation structure and a third isolation structure.

18. The integrated circuit of claim 17, further comprising:
- a spacer on sidewalls of the gate electrode structure and between the drain region and the source region.

19. The integrated circuit of claim 18, further comprising:
- a gate dielectric structure having first and second portions over the first and second wells, wherein the first portion of the gate dielectric structure is above the second portion of the gate dielectric structure.

20. The integrated circuit of claim 16, further comprising:
- a silicide layer over the first and second portions of the upper surface of the gate electrode structure.

* * * * *